(12) United States Patent
Kitzberger

(10) Patent No.: US 12,285,098 B2
(45) Date of Patent: Apr. 29, 2025

(54) COLLAPSIBLE SUPPORT FRAME FOR A HAMMOCK

(71) Applicant: Max Kitzberger, Neufelden (AT)

(72) Inventor: Max Kitzberger, Neufelden (AT)

( * ) Notice: Subject to any disclaimer, the term of this patent is extended or adjusted under 35 U.S.C. 154(b) by 208 days.

(21) Appl. No.: 18/023,591

(22) PCT Filed: Aug. 25, 2021

(86) PCT No.: PCT/AT2021/060296
§ 371 (c)(1),
(2) Date: Feb. 27, 2023

(87) PCT Pub. No.: WO2022/047512
PCT Pub. Date: Mar. 10, 2022

(65) Prior Publication Data
US 2023/0301419 A1    Sep. 28, 2023

(30) Foreign Application Priority Data
Sep. 2, 2020 (AT) .................................. 50171/2020

(51) Int. Cl.
*A45F 3/24* (2006.01)
(52) U.S. Cl.
CPC ...................... *A45F 3/24* (2013.01)
(58) Field of Classification Search
CPC ...... A45F 3/22; A45F 3/24; A45F 3/26; A45F 4/08
See application file for complete search history.

(56) References Cited
U.S. PATENT DOCUMENTS 33,678 A * 11/1861 Forbush .................... A45F 3/24
5/129
182,049 A * 9/1876 Arci ...................... A47C 3/0255
5/128
(Continued)

FOREIGN PATENT DOCUMENTS

AT       518829 A1   1/2018
AT       518829 B1   3/2018
(Continued)

OTHER PUBLICATIONS

Espacenet English language abstract for CN 103120469 A1, May 29, 2013.

*Primary Examiner* — George Sun
(74) *Attorney, Agent, or Firm* — Tiajoloff & Kelly LLP

(57) ABSTRACT

A collapsible support frame for a hammock (5) comprises a frame body (1) formed from a longitudinal member (2) and three struts at each of the two ends of the longitudinal member (2). Two of the struts serve as foot struts (3) and the third strut serves as a supporting arm (4) with an attachment point (15) for the hammock (5). The three struts at the two ends of the longitudinal member (2) and also the foot struts (3) at the opposite ends of the longitudinal member (2) are connected to one another, in each case, by tension means (12, 20) engaged at the strut ends. The struts can be folded out from an idle position, in which they are folded in against the longitudinal member (2), into a working position in which they are splayed out from the longitudinal member (2), and the attachment point (15) for the hammock (5) on the two supporting arms (4) is provided on one arm of a double-armed pivot lever (13), with the tension means (14) for the two foot struts (3) engaging on the other arm of said pivot lever.

13 Claims, 4 Drawing Sheets

(56) References Cited

U.S. PATENT DOCUMENTS

Figure 1:
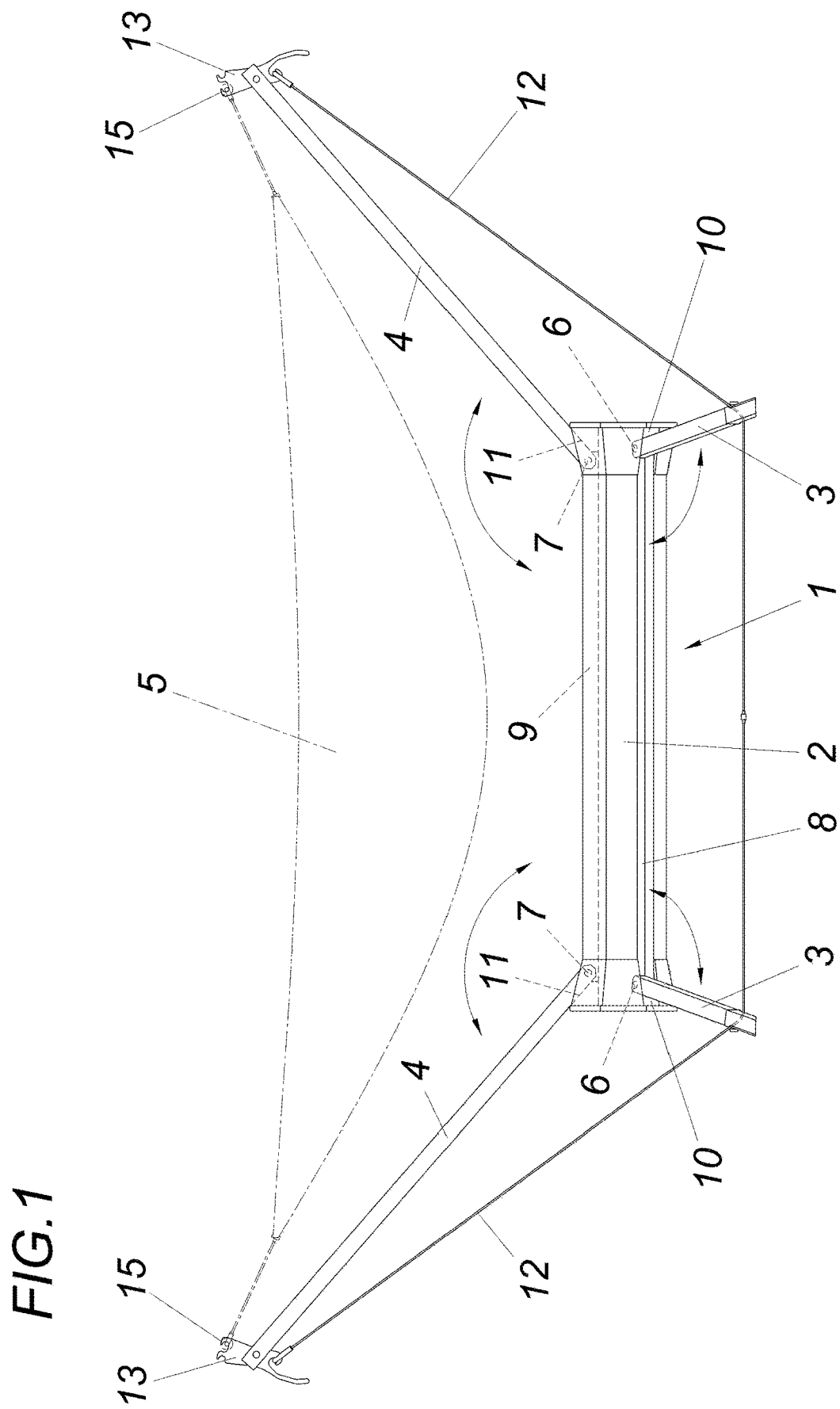

| | | | | |
|---|---|---|---|---|
| 337,792 | A | * | 3/1886 | Rudd ................... A45F 3/24 5/128 |
| 506,776 | A | * | 10/1893 | Ford .................... A45F 3/24 5/129 |
| 4,691,394 | A | * | 9/1987 | Woo ..................... A45F 3/24 5/120 |
| 4,797,961 | A | * | 1/1989 | Pasquariello ........ A45F 3/24 5/127 |
| 4,925,138 | A | * | 5/1990 | Rawlins ............... A45F 3/24 5/127 |
| 5,113,537 | A | * | 5/1992 | Turk .................... A45F 3/24 5/127 |
| 6,711,764 | B1 | * | 3/2004 | Mauze, Jr. ........... A45F 3/24 5/120 |
| 7,996,935 | B1 | * | 8/2011 | Chen .................... A45F 3/24 5/120 |
| 10,426,271 | B2 | | 10/2019 | Elmi |
| 2004/0205893 | A1 | * | 10/2004 | Chen .................... A45F 3/24 5/127 |
| 2013/0117931 | A1 | * | 5/2013 | Lemmens ............ A45F 3/24 5/120 |
| 2016/0088922 | A1 | * | 3/2016 | Frankson ............. A45F 3/24 5/129 |
| 2018/0035815 | A1 | * | 2/2018 | Elmi ..................... A47C 4/286 |
| 2018/0116379 | A1 | * | 5/2018 | Fenton ................. A45F 3/24 |
| 2019/0000220 | A1 | * | 1/2019 | Lemmens ............ A45F 3/24 |
| 2019/0075915 | A1 | * | 3/2019 | Wilke .................. A45F 3/24 |
| 2019/0328116 | A1 | * | 10/2019 | Kitzberger .......... A45F 3/24 |
| 2019/0365085 | A1 | * | 12/2019 | Goodwin ............. A45F 3/24 |

FOREIGN PATENT DOCUMENTS

| | | | | |
|---|---|---|---|---|
| CN | 103120469 A | * | 5/2013 | ............ A45F 3/24 |
| DE | 20110262 U1 | | 10/2001 | |
| DE | 202008007999 U1 | | 10/2009 | |
| EP | 3261492 A1 | | 1/2018 | |
| WO | 2016/135586 A1 | | 9/2016 | |

* cited by examiner

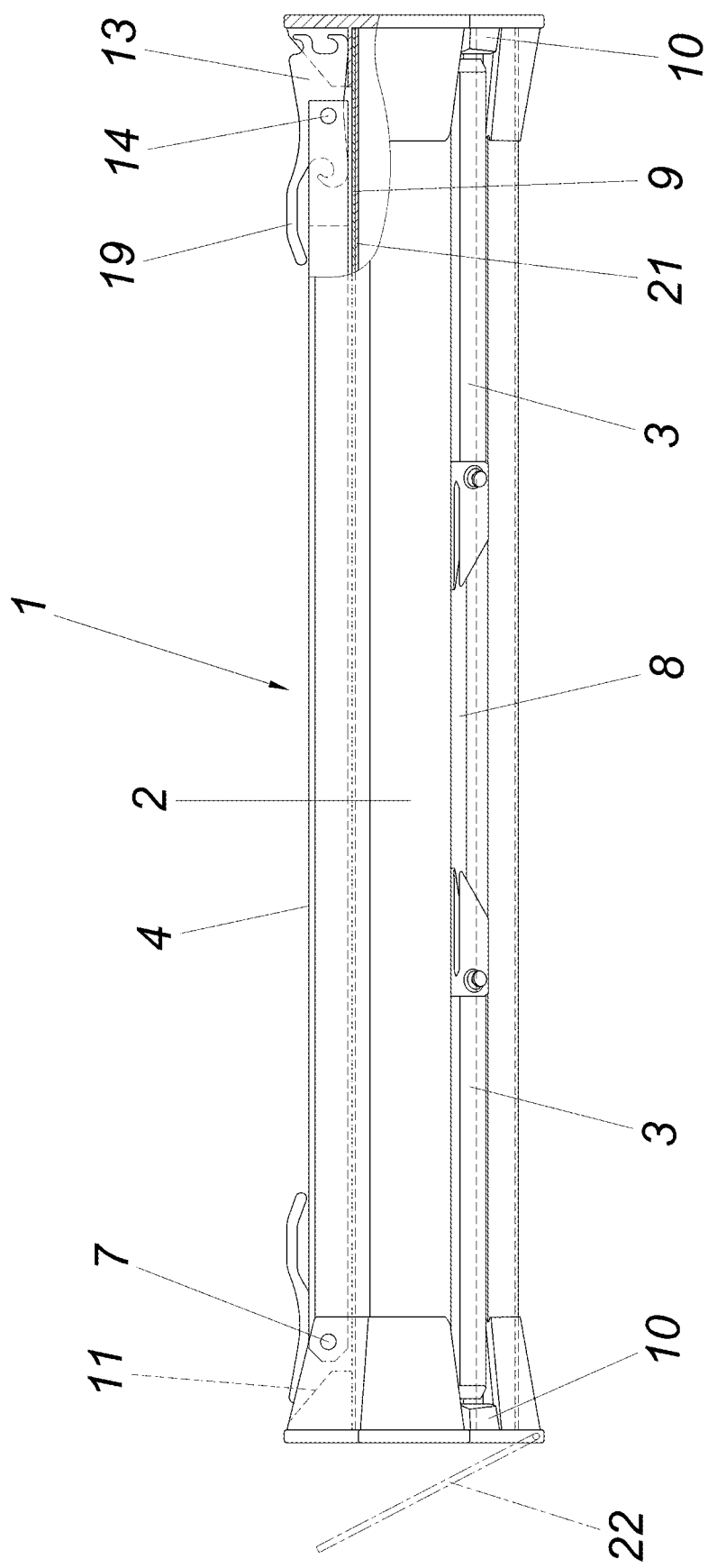

COLLAPSIBLE SUPPORT FRAME FOR A HAMMOCK

FIELD OF THE INVENTION

The invention relates to a collapsible support frame for a hammock, comprising a frame body formed from a longitudinal member and three struts provided at each of the two ends of the longitudinal member, two of which serve as foot struts and the third strut serves as a supporting arm with an attachment point for the hammock, wherein the three struts at each of the two ends of the longitudinal member and the foot struts at the opposite ends of the longitudinal member are connected to one another, in each case, by tension means engaging at the strut ends.

DESCRIPTION OF THE PRIOR ART

In order to obtain a simple, collapsible support frame for a hammock, it is known (DE 20110262 U1) to provide two supporting arms for the hammock with two foot struts hinged to the supporting arms in a stop-limited manner, which lie in one plane with the associated supporting arm and are braced by tensioning cables connecting the ends of the two foot struts to each other and to the end of the supporting arm. If these frame sections supported on the ground at the head and foot ends of the hammock are braced with a tension cable anchored to the ground, the stability of the two frame sections, which can be pivoted about the foot support, is achieved solely by the load on the hammock. To achieve a stable frame, the two head-side and foot-side supporting arms can be connected to each other by a longitudinal strut in the area of the joints between the supporting arm and the foot struts, in order to be able to brace the supporting arms at the ends of the longitudinal strut that are extended beyond the frame parts. If an articulated connection is provided between the longitudinal strut and the supporting arms, nothing is gained in terms of the stability of the frame. In the case of a rigid connection, however, this connection is in turn loaded with the bending moments that occur because the selected cable bracing can only ensure a stable triangular connection for the head-side and foot-side frame parts.

In order to avoid these disadvantages and to be able to safely absorb the weight and torque loads that occur, it has already been proposed (AT 518 829 B1) in the case of a collapsible support frame for a hammock having a frame body symmetrical to a longitudinal center plane and consisting of straight struts and node pieces connecting the struts to one another, which form plug-in receptacles for the struts, that the frame body comprises two node pieces with plug-in receptacles for three struts each that span a tetrahedron, of which two are designed as foot struts and the third strut, extending in the plane of symmetry between the two foot struts, is designed as a supporting arm for the hammock, that a longitudinal strut engaging in aligned plug-in receptacles of the node pieces is provided between the two node pieces on the side facing away from the tetrahedron, and that both the struts forming a tetrahedron in each case and the foot struts of the mutually opposite node pieces are connected to one another by tension means engaging at the strut ends. As a result of the additional mutual tension means bracing the struts extending from a node piece and spanning a tetrahedron with one another and the foot struts of the opposing tetrahedra, the struts are essentially stressed as compression members, so that the node pieces remain largely free from stresses due to bending moments. When the supporting frame is disassembled, however, the individual elements of the frame body are present as loose individual parts, which makes handling laborious. In addition, the respective weight of a user of the hammock is not taken into account with regard to load transfer.

SUMMARY OF THE INVENTION

The invention is thus based on the object of designing a dismountable support frame for a hammock in such a way that simple handling during assembly and folding of the support frame and, in addition, a stiffening of the frame body dependent on the weight of a user of the hammock can be ensured.

Starting from a collapsible support frame of the type described at the beginning, the invention solves the set object in that the struts can be folded out from an idle position, in which they are folded in against the longitudinal member, into a working position in which they are splayed out from the longitudinal member, and in that the attachment point for the hammock on the two supporting arms is provided on one arm of a double-armed pivot lever, with the tension means for the two foot struts engaging on the other arm of said pivot lever.

The provision of a longitudinal member at the ends of which the foot struts and supporting arms are hinged, offers the prerequisite for simple handling of the support frame for assembly and disassembly, because for this purpose only the struts have to be swung out into the splayed working position or folded in against the longitudinal member into the idle position. Due to the linkage of the struts to the longitudinal member on the one hand and their tensioning via tension means on the other, the struts remain essentially free of bending loads, so that the loads arising from a hammock use are transferred via the tension means acting on the strut ends, namely in the form of compressive loads on the struts. Since the supporting arms are connected with double-armed pivot levers, which form an attachment point for the hammock on one lever arm, while on the other lever arm the tension means act on the respective foot struts, a load compensation is achieved in a structurally simple manner, taking into account the respective weight of a hammock user. The lengths and angles of the lever arms allow corresponding transmission ratios to be maintained, which can be changed if necessary, for example by relocating the attachment point for the hammock.

In order to be able to provide a crowded design for the assembled support frame, the longitudinal member can have receiving grooves for the struts folded into the idle position, which are preferably latched in the receiving grooves. In general, the longitudinal member is shorter than twice the length of a supporting arm. For this reason, it is recommended that the supporting arms be hinged to the longitudinal member in a mutually offset manner so that they can be accommodated next to each other along the longitudinal member. This mutual offset of the supporting arms does not play any role for the suspension of the hammock, but ensures a compact size for the transport position of the support frame, because the minimum length of the folded frame body only has to correspond to the length of the supporting arms or twice the length of the foot struts, if the length of the supporting arms is less than twice the length of the foot struts, which, however, will usually not be the case.

In order to ensure a uniform load for the tension means connecting the struts at one end of the longitudinal member, these tension means can form a loop between the supporting arms and the associated foot struts that can be slidably hooked into the pivot levers of the supporting arms.

If the longitudinal member of the frame body is designed as a box girder, this results in advantageous loading conditions with the additional possibility of being able to use the cavity of the box girder as a storage space, in particular for the hammock and the tension means.

BRIEF DESCRIPTION OF THE INVENTION

Figure 2:
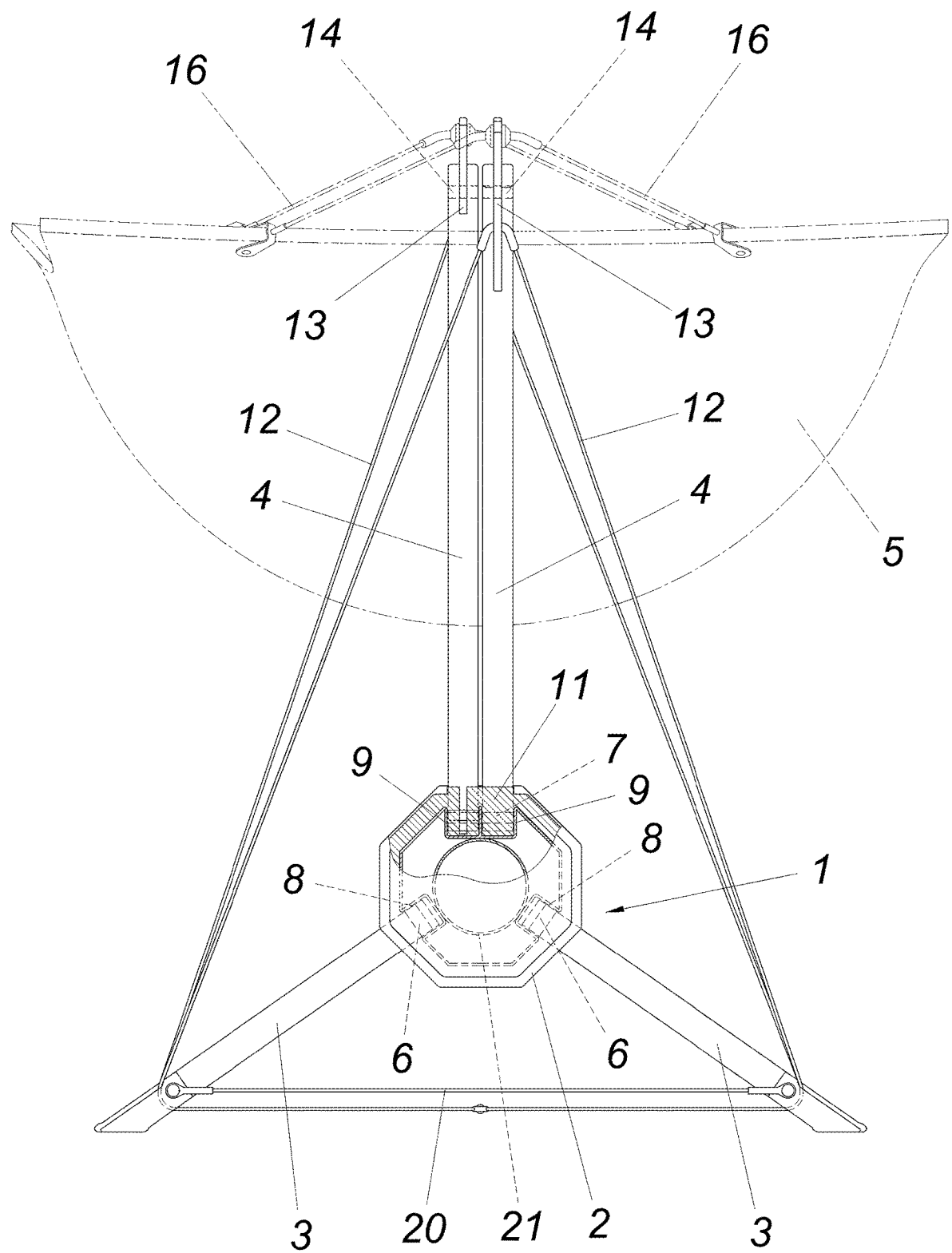
Figure 3:
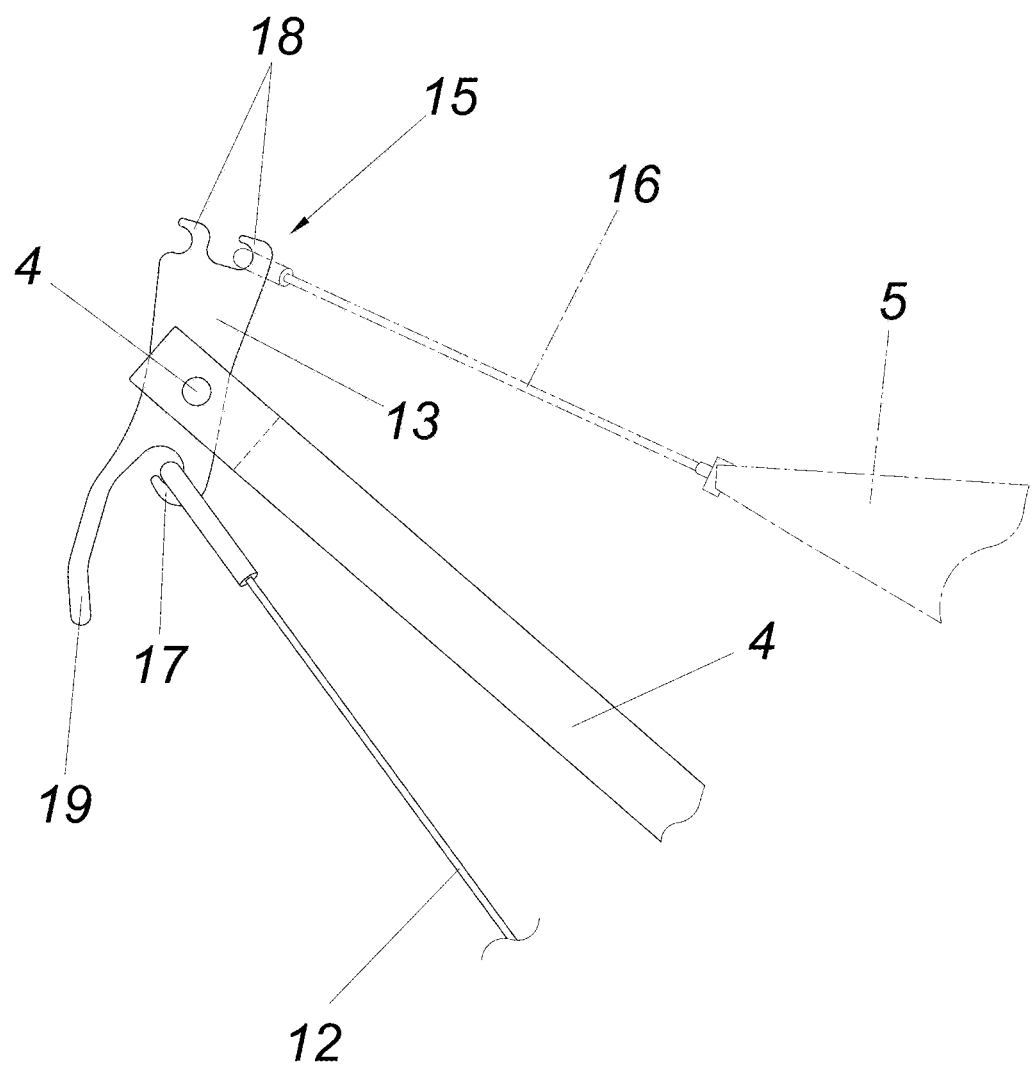

In the drawing, the subject matter of the invention is shown by way of example, wherein:

FIG. 1 shows a simplified side view of a support frame for a hammock according to the invention, FIG. 2 shows this support frame in a partially exposed front view on a larger scale, FIG. 3 shows the end of a supporting arm with a pivot arm for attaching the hammock in a side view on a larger scale, and FIG. 4 shows the support frame in a collapsed idle position in a side view on a larger scale.

DETAILED DESCRIPTION OF THE PREFERRED EMBODIMENTS

The support frame according to the invention has a frame body 1 which comprises a longitudinal member 2 in the form of a hollow box girder and three struts hinged to each of the two ends of this box girder, namely two foot struts 3 and one strut as a supporting arm 4 for a hammock 5. These struts can be splayed out from an idle position folded in against the longitudinal member 2 and shown in FIG. 4 about hinge axes 6, 7 into a working position splayed away from the longitudinal member 2 as shown in FIG. 1 and can be folded back in the opposite direction into the idle position against the longitudinal member 2. The longitudinal member 2 is provided with receiving grooves 8, 9 for receiving the struts. As can be seen in particular from FIG. 2, the struts forming the supporting arms 4 are arranged offset from one another at the two ends of the longitudinal member 2 in the direction of their hinge axes 7 in order to be able to store them next to one another along the longitudinal member 2 on account of their length in the folded-in state, the minimum length of which thus corresponds to the length of the supporting arms 4. Since the foot struts 3 have a length smaller than half the length of the supporting arms 4, the foot struts 3 hinged at both ends of the longitudinal member 2 can be folded in pairs into a common receiving groove 8, as can be seen in FIG. 4.

Although the splayed working position of the struts is specified by stops 10, 11, essentially no load moments of the struts are to be transferred via these stops 10, 11. For this reason, the struts are each connected to a tension means 12 at the two ends of the longitudinal member 2, which is preferably guided in the form of an endless loop for tension compensation, although this is not mandatory. While the tension means 12 are merely deflected around the ends of the foot struts 3, they do not engage the supporting arms 4 directly but via double-armed pivot levers 13, which are mounted on the supporting arm ends so as to be freely rotatable about axes 14 parallel to the pivot axes 7. The pivot levers 13 form, with their lever arm opposite the lever arm for the tension means 14, an attachment point 15 for the hammock 5, which can be suspended with the aid of a tension means loop 16 in a hook opening forming the attachment point 15, as can be seen in particular from FIG. 3. Since the pivot lever 13 forms two suspension hooks 18 for the hammock 5, in contrast to only one suspension hook 17 for receiving the tension means 12 connecting the three strut ends, the respective sag of the hammock 5 in the unloaded state can be adjusted by the selection of the respective suspension hook 18. In the loaded state, the pivot levers 13 result in a load compensation which ensures a largely moment-free loading of the struts. To make it easier to hook the tension means 12 or the tension means loop 16 into the hooks 17, 18, the pivot lever 13 can be formed with a handle attachment 19.

However, the foot struts 3 on each end of the longitudinal member 2 must not only be connected to each other and to the supporting arm 4 by the tension means 12, but must also be braced relative to the foot struts 3 at the opposite ends of the longitudinal member 2. For this purpose, a preferably also endlessly guided tension means 20 is provided, whose sections between the two ends of the longitudinal member 2 are either guided in parallel or extend in a crossed manner.

The longitudinal member 2, which is designed as a hollow box girder, can advantageously be used as a storage space, in particular for the hammock 5 and the tension means 12, 20. For this purpose, a tubular piece 21 forming the storage space can be provided inside the box girder, which is closed at the end by an openable lid 22. A lid 22 in the form of a flap is indicated by a dashed dot in FIG. 4 in a partially open position.

The invention claimed is:

1. A collapsible support frame for a hammock, said support frame comprising:
    a frame body formed from a longitudinal member having two opposite ends; and
    three struts provided at each of the two ends of the longitudinal member;
    two of said struts serving as foot struts and a third strut serving as a supporting arm with an attachment point for the hammock;
    wherein the three struts at the two ends of the longitudinal member are connected to each other by tension structures engaging strut ends of each of the struts, and the foot struts at the opposite ends of the longitudinal member are connected to one another by tension structures engaging the strut ends thereof;
    wherein the struts are supported to be folded out from an idle position, in which the struts are folded in against the longitudinal member, into a working position in which the struts are splayed out from the longitudinal member; and
    wherein the respective attachment point for the hammock on each of the two supporting arms is on one arm of a respective double-armed pivot lever, with the tension structures for the two foot struts engaging the other arm of said double-armed pivot lever;
    said double-armed pivot lever being supported on the associated supporting arm for pivoting movement about a transverse axis, wherein, during said pivoting movement, the attachment point on the one arm of the double-armed pivot lever moves toward or away from the other of the support arms.

2. The support frame according to claim 1, wherein the longitudinal member has receiving grooves receiving the struts folded into the idle position.

3. The support frame according to claim 2, wherein the struts forming the supporting arms are hinged to the longitudinal member in a mutually offset manner.

4. The support frame according to claim 1, wherein each of the tension structures between the supporting arms and the associated foot struts forms a respective movable loop suspended in the respective pivot lever.

5. The support frame according to claim 1, wherein the longitudinal member comprises a hollow box girder forming a storage space.

6. The support frame according to claim 2, wherein each of the tension structures between the supporting arms and the associated foot struts forms a respective movable loop suspended in the respective pivot lever.

7. The support frame according to claim 3, wherein each of the tension structures between the supporting arms and the associated foot struts forms a respective movable loop suspended in the respective pivot lever.

8. The support frame according to claim 2, wherein the longitudinal member comprises a hollow box girder forming a storage space.

9. The support frame according to claim 3, wherein the longitudinal member comprises a hollow box girder forming a storage space.

10. The support frame according to claim 4, wherein the longitudinal member comprises a hollow box girder forming a storage space.

11. The support frame according to claim 6, wherein the longitudinal member comprises a hollow box girder forming a storage space.

12. The support frame according to claim 7, wherein the longitudinal member comprises a hollow box girder forming a storage space.

13. The support frame according to claim 1, wherein the axes of the double-armed pivot levers are horizontal and the pivoting movements of the double-armed pivot levers are each in a vertical plane.

\* \* \* \* \*